United States Patent
Gamota et al.

[11] Patent Number: 5,814,401
[45] Date of Patent: Sep. 29, 1998

[54] SELECTIVELY FILLED ADHESIVE FILM CONTAINING A FLUXING AGENT

[75] Inventors: Daniel R. Gamota, Palatine, Ill.;
Robert W. Pennisi, Boca Raton, Fla.;
Cynthia M. Melton, Bollingbrook, Ill.

[73] Assignee: Motorola, Inc., Schaumburg, Ill.

[21] Appl. No.: 794,826

[22] Filed: Feb. 4, 1997

[51] Int. Cl.$^6$ .................................................. C09J 7/02
[52] U.S. Cl. ........................... 428/343; 174/260; 361/743; 361/807; 428/335 R; 428/355 EP
[58] Field of Search .................... 428/343, 355 R, 428/355 EP; 361/807, 743; 174/260

[56] References Cited

U.S. PATENT DOCUMENTS

| | | | |
|---|---|---|---|
| 5,128,746 | 7/1992 | Pennisi et al. | 357/72 |
| 5,136,365 | 8/1992 | Pennisi et al. | 357/72 |
| 5,293,067 | 3/1994 | Thompson et al. | 257/668 |
| 5,473,512 | 12/1995 | Degani et al. | 361/760 |

*Primary Examiner*—Jenna Davis
*Attorney, Agent, or Firm*—Dale W. Dorinski

[57] ABSTRACT

A selectively filled thermally curable adhesive film (10) contains a fluxing agent for reflow soldering an electronic device to a substrate. The adhesive film has a central, region (12) and a boundary region (14) surrounding the central region. The central region consists of an adhesive that is filled with an inert filler to reduce the co-efficient of thermal expansion of the adhesive. The boundary region consists of an unfilled adhesive and a fluxing agent. The film may be used to adhesively bond a flip chip semiconductor die (20) to a substrate (21). When solder bumps (22) on the die are reflowed, the fluxing agent acts to remove any oxides present on the solderable surfaces of the substrate or the die.

23 Claims, 2 Drawing Sheets

SELECTIVELY FILLED ADHESIVE FILM CONTAINING A FLUXING AGENT

CROSS REFERENCE TO RELATED APPLICATIONS

This application is related to U.S. application Ser. No. 08/794,825, entitled "Flip Chip Attachment," by Gamota, et al., filed concurrently herewith and assigned to Motorola, Inc.

TECHNICAL FIELD

This invention relates generally to electronic circuitry, and more particularly to electrical interconnection methods, and most particularly to an adhesive for flip chip attachment.

BACKGROUND OF THE INVENTION

The solder bump interconnection was developed to eliminate the expense, unreliability, and low productivity of manual wire bonding. Solder bump interconnection technology for flip chip integrated circuits has been practiced in one form or another for approximately 20 years. Whereas the initial, low complexity integrated circuits typically had peripheral contacts, the flip chip bumping technology has allowed considerable increase in interconnect density as it progressed to full population area arrays. The controlled collapse chip connection (C4) utilizes solder bumps deposited on wettable metal terminals on the die and a matching footprint of solder wettable terminals on the substrate. The upside down integrated circuit (flip chip) is aligned to the substrate and all joints are made simultaneously by reflowing the solder. In the controlled collapse method, a bump of solder is deposited on the terminals of the integrated circuit, and the flow of solder on the integrated circuit is limited by the size of the solderable pad which is revealed through an opening in the chemically vapor deposited glass passivation on the integrated circuit.

Selection of the solder alloy has been defined on the basis of melting point. High lead solders have been used when bonding the integrated circuit to alumina ceramic substrates because of the high melting point of the alloy, allowing further processing of the assembled circuit. Joining to organic carriers such as epoxy or polyimide circuit boards requires lower melting solder alloys. Solders such as eutectic tin/lead solder (melting point 183° C.) or lead/indium solder (melting point 220° C.) have been used.

To join the integrated circuit to the substrate, a flux, either water-white rosin or water soluble flux, is placed on the substrate as a temporary adhesive to hold the integrated circuit in place. The assembly is subjected to a reflow thermal cycle, joining the die to the substrate in an oven or furnace. The surface tension of the solder aligns the die to the substrate terminals. After reflow, the flux residue must be removed to prevent corrosion of the die. Chlorinated, fluorinated or hydrocarbon solvents are used to remove the rosin, or water with surfactants is used to remove a water soluble flux. Due to the close proximity of the die to the substrate (typically 0.02 to 0.1 mm), removing the flux residue from under the die is a difficult operation requiring sophisticated cleaning regimes and a significant expenditure of time. Insuring complete removal of all flux residue has been the subject of much effort in the industry.

After cleaning, the assembly is electrically tested, and further packaging is added to provide environmental protection. Passivation, encapsulation, or addition of a cover are the usual methods. In the case of encapsulation, a liquid polymer is applied around and under the die. The very small gap between the die and the substrate is filled by depositing an organic resin around the periphery of the die, where it is drawn into the gap by capillary action. As the size of dies increase, the limiting effect of capillary action becomes critical and leaves an area of the die unprotected. Historically, the organic resins of choice have been silicones and epoxies, with epoxies finding greater favor due to their superior adhesion to ceramic substrates. The thermal expansion coefficient of epoxies is significantly higher than that of the flip chip die, and thermal stress develops between the substrate, the die and the encapsulant. Cured epoxies are hard and do not posses the flexibility of silicones, and early device failure can result from crack formation in the die. The use of inorganic fillers also affects thermal conductivity and the level of ionic contaminants. An improved method of encapsulating flip chip integrated circuits is needed that provides better compatibility between the flip chip and the substrate.

DETAILED DESCRIPTION OF THE PREFERRED EMBODIMENT

A selectively filled thermally curable adhesive film contains a fluxing agent for reflow soldering an electronic device to a substrate. The adhesive film has a central, interior, region and a boundary region surrounding the central region. The central region consists of an adhesive that is filled with an inert filler to reduce the co-efficient of thermal expansion of the adhesive. The boundary region consists of an unfilled adhesive and a fluxing agent. The film may be used to adhesively bond a flip chip semiconductor die to a substrate. When solder bumps on the die are reflowed, the fluxing agent acts to remove any oxides present on the solderable surfaces of the substrate or the die, and thus eliminates the need for additional fluxes. The central region of the adhesive film lies under the center of the die where there are no solder bumps, and thus acts to stabilize the die after bonding it to the substrate. As used herein, the term "electronic device" includes, but is not limited to, a single semiconductor integrated circuit die, a module comprising one or more die located on and connected to an interconnection substrate, or a composite of one such die or module that is flip-chip or otherwise bonded to either another such chip or another such module.

Figure 1:
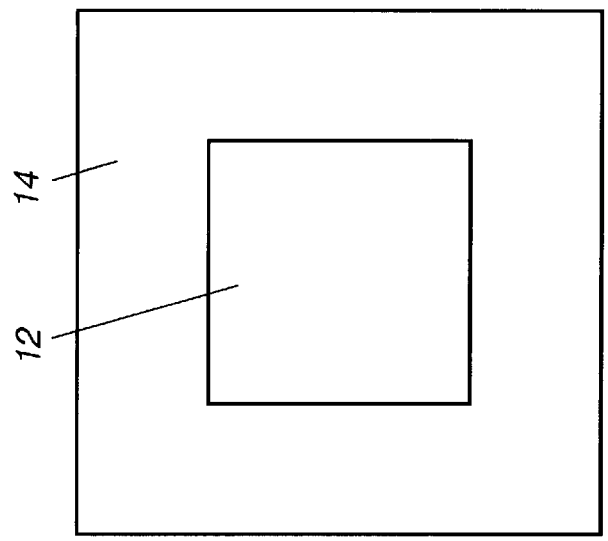
FIG. 1 is a plan view of a selectively filled adhesive film in accordance with the invention.

While the specification concludes with claims defining the features of the invention that are regarded as novel, it is believed that the invention will be better understood from a consideration of the following description in conjunction with the drawing figures. Referring now to FIG. 1, a selectively filled, thermally curable adhesive film 10 is shown in plan view. As used herein, the term "adhesive film" includes, but is not limited to, unsupported adhesive films that are essentially two-dimensional in nature. Typically, these films consist of B-staged epoxy or other types of adhesives that are in a solid or semi-solid form that can be easily handled. However, the use of the term "adhesive film" may also encompass other adhesive films that are less dimensionally stable. That is, adhesives that are flowable or of gel-like consistency. The selectively filled adhesive film 10 typically consists of two parts. A first part comprising a central region 12 lies in the interior of the film. This central region 12 is surrounded by a boundary region 14 that typically forms a border around the perimeter of the central region. The adhesive in the central region 12 contains an inert filler material, such as silica, that is used to reduce the thermal expansion coefficient of the adhesive. Other inert fillers such as titanium dioxide, aluminum oxide, barium oxide, etc. may also be used with equivalent efficiency. The object of filling the adhesive in the central region 12 with an inert filler is to reduce the thermal expansion coefficient of the adhesive and, thus, combinations of adhesive and filler that will accomplish this end may find use in the invention.

Unlike the central region 12, the adhesive in the boundary region 14 is not filled with an inert filler, but instead contains a fluxing agent. The adhesive material is formulated to contain the fluxing agent and a curing agent for the adhesive so that the adhesive does not cure immediately at room temperature. One example of suitable adhesive material is an epoxy resin made from bisphenol and epichlorihydrin. Typically in these cases, the curing agent or hardener is an amine or anhydride. Other two-part resin systems, such as polyester resins with suitable hardeners, may also be used. The purpose of the fluxing agent is to provide fluxing action for a subsequent soldering operation. The amount of the fluxing agent in the adhesive material may range from about 0.1 to about 16 weight percent depending upon the activity of the particular fluxing agent, the solder alloy selected, and the substrate metallization system.

One example of a reflowable, selectively filled encapsulant film made in accordance with the invention is a film of approximately 0.075 mm thick, consisting of the two regions.

Center Region

54% Min-sil Silica

27% Ciba Geigy Araldite GT6084 epoxy

9% Ciba Geigy Araldite PY322 epoxy

9% Methylhexahydrophthalic anhydride

1% Lindride Accelerator

Boundary Region

80% Ciba Geigy Araldite GT 6084 epoxy 0.5% Ciba Geigy Araldite PY322 epoxy

19% Methylhexahydrophthalic anhydride 0.5% Lindride Accelerator

All of the above percentages are given in weight percent. The methylhexahydrophthalic anhydride serves as both the fluxing agent to reduce or remove metal oxides and also as the cross-linking agent to cure the epoxy resin. Obviously, other fluxing agents may find use in this invention, depending upon the particular epoxy system chosen for the adhesive film. However, one particular advantage for this system is that the same material or chemical can be used as both a fluxing agent and as a cross-linking agent to cure the resin. Although this example contains 54% silica by weight, it is envisioned that filler levels between 20% and 80% by weight can be used with efficacy.

Figure 2:
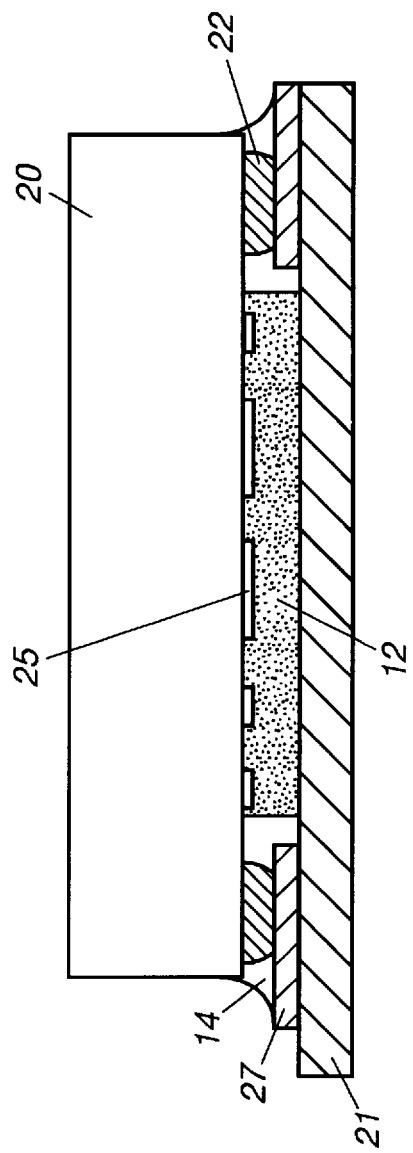
FIG. 2 is a cross sectional view of a flip chip mounted to a substrate with a selectively filled adhesive film in accordance with the invention.

Referring now to FIG. 2, a cross-sectional view of a flip-chip mounted to a substrate using the selectively filled adhesive film of the invention is shown. It should be appreciated that although the drawing depicts an electronic device as a flip-chip integrated circuit die connected to a substrate, embodiments using other types of surface-mounted components having solder bumps will fall within the scope of this invention. A device 20 containing solder bumps 22 is positioned so that the solder bumps and an active surface 25 of the device are facing the substrate 21 and aligned with a metallization pattern 27 on the substrate. The adhesive film is either attached to the electronic device or to the substrate in a manner such that the boundary region 14 of the adhesive film containing the fluxing agent lies directly over the solder bumps of the electronic device or the interconnection pads on the substrate. The central region 12 of the adhesive film that contains the filled adhesive is aligned to be in the central portion of the electronic device, that is in an area where there are no solder bumps. The electronic device is then moved into intimate contact with the metallization pattern on the substrate so that the unfilled adhesive in the boundary region 14 that contains the fluxing agent wets the bumps 22 of the device and the metallization pattern 27 on the substrate. In addition to providing fluxing action, the adhesive also provides a "tacking" force that serves to hold the electronic device in place prior to reflow operations. Because the adhesive is not fully cured, it provides some tacking effect and can be used to aid in placement of surface mount devices on substrates. Furthermore, when completely cured, it can be seen the adhesive serves as an underfill encapsulant to environmentally protect the active surface of the electronic device.

The assembly is then reflowed in a conventional manner, causing the fluxing agent to become activated, reducing any oxides on the solder and the metallization surfaces of the substrate and permitting alloying of the solder to the metallization pattern. During the reflow process, the adhesive may also be cured into a solid form. (Depending upon the chemistry of the adhesive system, a second post-curing operation may optionally be employed to completely cure the adhesive.) During this reflowing/curing step, the electronic device becomes encapsulated on one side by the adhesive. Typically, the unfilled adhesive in the boundary region flows out to a certain extent around the perimeter forming a meniscus and, thus, provides a continuous seal around the periphery of the electronic device to protect the active surface from environmental contamination. As such, no further cleaning or encapsulating operations are required.

In order to test the efficacy of the invention, a flip-chip semiconductor die was bonded to a conventional printed circuit board made from woven glass mat impregnated with polyimide resin. After reflow, the soldered flip-chip assembly was subjected to thermal cycling of −55° C. to +125° C. The assembly using the selectively filled film of the invention did not experience a solder joint failure until after 600 cycles and had a mean time-to-failure of 2300 cycles. In contrast, a flip-chip assembly made with an underfill adhesive that did not contain a selectively filled portion, experienced a first failure after only 200 cycles and only had a mean time-to-failure of 400 cycles. Metallurgical systems typically used for these types of applications are bump metallurgies which include 97% lead, 3% tin, die bumps assembled to printed circuit board substrate pads that contain a coating of 63% tin, 37% lead eutectic solder.

In summary, a selectively filled adhesive film contains a fluxing agent that is useful in mounting an electronic device to a substrate. The center portion of the adhesive film is filled with the material in order to reduce the thermal expansion coefficient to less than one-half of an unfilled adhesive. A boundary region surrounding this filled adhesive contains a fluxing agent to reduce oxides during a soldering operation. Filler levels between 20% and 85% by weight, typically silica, are used in conjunction with epoxy resins in order to create an electrical component assembly that can survive large numbers of thermal cycling excursions.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A selectively filled thermally curable adhesive film containing a fluxing agent for reflow soldering an electronic device to a substrate, comprising:
   an adhesive film having a central region and a boundary region surrounding the central region;
   the boundary region consisting of a first adhesive and a fluxing agent;
   the central region comprising a second adhesive and an inert filler, said inert filler having a co-efficient of thermal expansion value less than one-half of the co-efficient of thermal expansion value of the second adhesive.

2. The adhesive film as described in claim 1, wherein the first adhesive comprises an epoxy resin.

3. The adhesive film as described in claim 2, wherein the epoxy resin contains a curing agent.

4. The adhesive film as described in claim 3, wherein the curing agent is methylhexahydrophthalic anyhdride.

5. The adhesive film as described in claim 4, wherein the fluxing agent is methylhexahydrophthalic anyhdride.

6. The adhesive film as described in claim 1, wherein the second adhesive comprises an epoxy resin.

7. The adhesive film as described in claim 6, wherein the epoxy resin contains a curing agent.

8. The adhesive film as described in claim 7, wherein the curing agent is methylhexahydrophthalic anyhdride.

9. The adhesive film as described in claim 8, wherein the fluxing agent is methylhexahydrophthalic anyhdride.

10. The adhesive film as described in claim 1, wherein the fluxing agent is present in an amount sufficient to remove oxide coatings from interconnection sites on the substrate or on the electronic device.

11. The adhesive film as described in claim 1, wherein the first adhesive is in a tacky state and serves to temporarily attach the electronic device to the substrate prior to thermally curing the adhesive film, and wherein the adhesive film is thermally cured when the electronic device is reflow soldered to the substrate.

12. The adhesive film as described in claim 1, wherein the inert filler comprises silica powder.

13. The adhesive film as described in claim 1, wherein the inert filler comprises between 20% and 85% by weight of the central region.

14. The adhesive film as described in claim 1, wherein the adhesive film is an unsupported film.

15. The adhesive film as described in claim 11, wherein the adhesive in the central region and the adhesive in the boundary region are epoxies.

16. A selectively filled thermally curable adhesive film containing a fluxing agent for reflow soldering an electronic device to a substrate, comprising:
    an unsupported adhesive film having a central region and a boundary region, said boundary region surrounding the central region;
    the boundary region consisting of an unfilled epoxy adhesive and an anhydride fluxing agent; and
    the central region comprising a silica filled epoxy adhesive, said silica present in an amount between 20% and 85% by weight.

17. The adhesive film as described in claim 16, wherein the anhydride fluxing agent is also a curing agent for the adhesive.

18. The adhesive film as described in claim 17, wherein the anhydride fluxing agent is methylhexahydrophthalic anyhdride.

19. The adhesive film as described in claim 18, wherein the methylhexahydrophthalic anyhdride is present in an amount sufficient to cure the epoxy resin and to reduce metal oxide coatings on interconnection sites on the substrate or on the electronic device.

20. The adhesive film as described in claim 16, wherein the unfilled epoxy adhesive is in a tacky state and serves to temporarily attach the electronic device to the substrate prior to thermally curing the adhesive film.

21. The adhesive film as described in claim 20, wherein the adhesive film is thermally cured when the electronic device is reflow soldered to the substrate.

22. The adhesive film as described in claim 16, wherein the adhesive film is the same size as the electronic device.

23. An electrical component assembly, comprising:
    an electronic device having a plurality of solder bumps on a perimeter portion of the device;
    a circuit carrying substrate having a plurality of electrical terminations corresponding to the solder bumps;
    the electronic device solder bumps soldered to the circuit carrying substrate electrical terminations;
    a silica-filled thermally cured adhesive material selectively disposed between the electronic device and the circuit carrying substrate in a central portion of the electronic device; and
    an unfilled cured adhesive material containing a fluxing agent selectively disposed between the electronic device and the circuit carrying substrate in the perimeter area of the electronic device, said unfilled cured adhesive material encapsulating the solder bumps and having a co-efficient of thermal expansion greater than that of the silica-filled thermally cured adhesive material.

* * * * *